United States Patent [19]
Roas

[11] Patent Number: 5,292,717
[45] Date of Patent: Mar. 8, 1994

[54] METHOD FOR THE PRODUCTION OF A STRUCTURED COMPOSITE WITH HIGH-TEMPERATURE SUPERCONDUCTOR MATERIAL

[75] Inventor: Bernhard Roas, Erlangen, Fed. Rep. of Germany

[73] Assignee: Siemens Aktiengesellschaft, Munich, Fed. Rep. of Germany

[21] Appl. No.: 822,973

[22] Filed: Jan. 21, 1992

[30] Foreign Application Priority Data

Jan. 21, 1991 [DE] Fed. Rep. of Germany ....... 4101604

[51] Int. Cl.$^5$ ............................................. H01L 39/24
[52] U.S. Cl. ...................................... 505/1; 505/728; 427/62; 427/63; 134/1; 134/2; 134/38
[58] Field of Search ...................... 505/1, 728; 427/62, 427/63; 134/1, 2, 38

[56] References Cited

U.S. PATENT DOCUMENTS

| | | | |
|---|---|---|---|
| 4,218,532 | 8/1980 | Dunkleberger | 430/314 |
| 4,459,321 | 7/1984 | Kim | 427/63 |
| 4,813,769 | 4/1990 | Kanda et al. | 156/652 |
| 4,956,335 | 9/1990 | Agostinelli et al. | 505/1 |
| 5,126,315 | 6/1992 | Nishino et al. | 505/1 |

FOREIGN PATENT DOCUMENTS

| | | |
|---|---|---|
| 0352471A2 | 1/1990 | European Pat. Off. |
| 3822904 | 1/1990 | Fed. Rep. of Germany |
| 3822905 | 1/1990 | Fed. Rep. of Germany |

OTHER PUBLICATIONS

Patent Abstract of Japan, JP-1-161787, Jun. 26, 1989, Yoshida Jiro et al.
Physica C, pp. 185-189 (1991), 2595-2596, North Holland, Elsevier Science Publishers B.V., B. Roas et al.: Basic Elements of High Temperature Superconductor Wiring.
Appl. Phys. Lett. 56 (14), Apr. 2, 1990, pp. 1374-1376, J. R. Phillips et al.: Vapor-deposited superconducting $YBa_2Cu_3O_7$-lines: Effect of thickness and width on morphology.
Appl. Phys. Lett. 59 (20), Nov. 11, 1991, pp. 2594-2596, B. Roas: Patterning of epitaxial $YBa_2Cu_3O_x$ insulator multilayers with a high temperature-resistant lift-off mask.

*Primary Examiner*—Roy King
*Attorney, Agent, or Firm*—Kenyon & Kenyon

[57] ABSTRACT

A method for producing a structured layer of a first material having at least one recess of a predetermined geometrical shape on a substructure formed of at least one second material that includes a metal oxide superconductor material with a high transition temperature which is sensitive to solvents containing acids includes the steps of: forming a first composite by applying a varnish layer to the substructure which is soluble in a first solvent that does not attack the substructure such that the varnish layer has a structure corresponding to the structure of the structured layer of the first material to be produced; cold depositing on the first composite an auxiliary layer of a third material that is soluble in a second solvent which does not attack the first and second materials; forming a second composite from the first composite by removing with the first solvent the varnish layer along with a part of the auxiliary layer resting thereon; applying a coating layer of the first material to the second composite at the elevated deposition temperature that is approximately between 150° C. and 1000° C. in an atmosphere containing oxygen; and removing with the second solvent a remaining part of the auxiliary layer remaining in the area of the at least one recess along with the portion of the coating layer resting thereon. The third material is chosen such that it cannot be attacked by the first solvent and does not enter into any reaction with the first and second materials at an elevated deposition temperature at which the first material is deposited, and further which is itself temperature resistant.

23 Claims, 3 Drawing Sheets

METHOD FOR THE PRODUCTION OF A STRUCTURED COMPOSITE WITH HIGH-TEMPERATURE SUPERCONDUCTOR MATERIAL

BACKGROUND OF THE INVENTION

The present invention relates generally to a method for producing a structured layer of a first material and more particularly to a method for producing a structured layer of a first material having at least one recess of a predetermined geometrical shape on a substructure which may be structured, if necessary.

The substructure used in such a method includes at least one second material, with one of the materials being a metal oxide superconductor material having a high transition temperature and which is sensitive to solvents containing acids. The first material is to be applied to the substructure in an atmosphere containing oxygen at an elevated deposition temperature that is between 150° C. and 1000° C. Such a known method is disclosed, for example, in DE-OS 38 22 905.

Superconductive metal oxide compounds having high transition temperatures $T_c$, particularly above 77° K. which can therefore be cooled with liquid nitrogen, have been generally known for several years. Corresponding high-temperature superconductor materials, which will be herein referred to as "HTSC materials", are based, for example, on a system having at least four components of the type Me1-Me2-Cu-O, where the component Me1 contains at least a rare earth metal including yttrium and the component Me2 contains at least an earth alkali metal. The primary representative of this group is the system Y-Ba-Cu-O. In addition, phases of five-component cuprates, such as the system Bi-Sr-Ca-Cu-O or Tl-Ba-Ca-Cu-O, also exhibit transition temperatures $T_c$ above 77° K.

For the production of multi-layer structures with thin films made of known HTSC materials, it is necessary to be able to form structured insulator layers and/or structured HTSC layers on a suitable substructure without damaging the HTSC material while adhering to the conditions necessary for epitaxis or at least texturization patterning. Known insulator materials suitable for use as HTSC materials include, for example, $SrTiO_3$, $LaAlO_3$, $NdGaO_3$, $MgO$ and $ZrO_2$. Texturization of a corresponding insulator layer which grows epitaxially on an HTSC layer at a high temperature, for example at 800° C., is practically impossible with chemical or physical chemical methods, such as wet chemical etching or reactive ion etching. This is because all known etchants which attack the insulator material also destroy the HTSC material. For example, the known superconductor material Y-Ba-Cu-O is so sensitive to acids that it can be structured with wet chemicals using phosphoric acid in an acid/water concentration of 1/100. Furthermore, all insulator materials known for use in HTSC technology which are capable of epitaxis are difficult to dissolve, or do not dissolve at all, even in concentrated acids.

Therefore, attempts have been made to structure insulator layers by means of ion beam etching. With such a method, however, it is very difficult to determine the etching time once the HTSC material is exposed. Furthermore, this etching process can only be used if the insulator layer has a uniform thickness throughout. Also, only etching masks that are resistent to ion beams, and particularly those made of metal, can be used. In addition, the technical effort required for the structuration step is relatively great, since the work has to be carried out in a high-vacuum chamber that has a large-area ion beam.

DE-OS 38 22 905, for example, which was mentioned above, discloses the method of vacuum evaporating the insulator material through a process mask to be applied to the HTSC material, more or less floating on it. In this case, the mask has to be fixed in place with great precision, which is in the $\mu m$ range, and it cannot slip or become damaged even when under very great thermal stress, such as occurs during the required temperature transition from room temperature to approximately 800° C. Since masks which make contact change the local temperature of the layer underneath them, problems due to heat accumulation, which may lead to the destruction of the HTSC film, cannot be prevented.

The problem with the prior art is that no method can produce a structured layer of an HTSC material or an insulator material on a preselected, possibly structured substructure used in HTSC technology, without the occurrence of any damage or destruction of the HTSC material.

SUMMARY OF THE INVENTION

The present invention provides a method for producing a structured layer of a first material having at least one recess of a predetermined geometrical shape on a substructure formed of at least one second material that includes a metal oxide superconductor material with a high transition temperature which is sensitive to solvents containing acids. The method includes the steps of: forming a first composite by applying a varnish layer to the substructure which is soluble in a first solvent that does not attack the substructure such that the varnish layer has a structure corresponding to the structure of the structured layer of the first material to be produced; cold depositing on the first composite an auxiliary layer of a third material that is soluble in a second solvent which does not attack the first and second materials; forming a second composite from the first composite by removing with the first solvent the varnish layer along with a part of the auxiliary layer resting thereon; applying a coating layer of the first material to the second composite at the elevated deposition temperature that is approximately between 150° C. and 1000° C. in an atmosphere containing oxygen; and removing with the second solvent a remaining part of the auxiliary layer remaining in the area of the recess along with the portion of the coating layer resting thereon. The third material is chosen such that it cannot be attacked by the first solvent and does not enter into any reaction with the first and second materials at an elevated deposition temperature at which the first material is deposited, and further which is itself temperature resistant.

An advantage provided by the method of the present invention includes the possibility of producing any desired structures with HTSC and/or insulator materials, without the HTSC material being attacked. This result is accomplished by using known, so-called lift-off techniques for the wet chemical removal of the varnish layer along with the part of the auxiliary layer located thereon. The lift-off techniques are also used for the wet chemical removal of the part of the auxiliary layer remaining in the predetermined recess along with the part of the coating layer located thereon. In particular, this method allows the formation of multi-layer structures such as those represented by circuits or circuit parts with HTSC thin films by using first materials which can be applied to second materials only at high temperatures of up to 1000° C.

DETAILED DESCRIPTION

Figure 1:
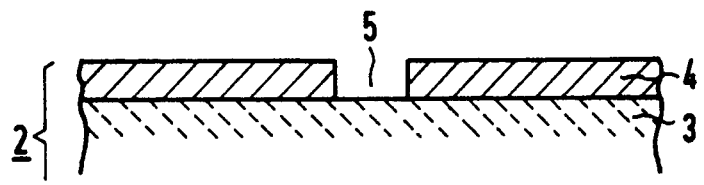
FIGS. 1, 2, 3, 4, 5 and 6 illustrate the individual method steps of the present invention for producing a structured layer of an insulator material on a structured layer of an HTSC material, which is shown in cross-section.

According to the present invention, a structured layer of a predetermined first material is to be produced on a substructure, in an atmosphere containing oxygen, as is required for the formation of known HTSC materials. The first material is to be applied only at high temperatures. The substructure of the embodiment of the invention shown in FIG. 1, designated by reference numeral 2, may be a known substrate 3, on which an HTSC layer 4 is formed in a known manner using thin-layer technology. In particular, the substrate may be formed from an insulator material on which the HTSC material can grow epitaxially. The HTSC is designated as the second material in the method according to the invention and may be a material such as $YBa_2Cu_3O_{7-x}$ (with $0.5 < x < 1$). Corresponding insulator materials are, for example, $SrTiO_3$, $LaAlO_3$, $NdGaO_3$, MgO or Y-stabilized $ZrO_2$, where it is advantageous if the unit cell in each case is adapted to the dimensions of the unit cell of the HTSC material that is used. The HTSC material of the layer 4 can be structured, if necessary, so that the substrate 3 is not covered with the HTSC material in a clearance area 5.

Figure 2:
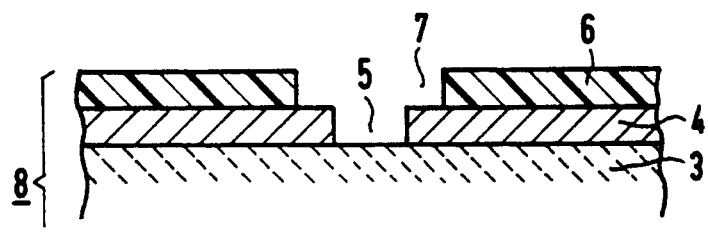

On the substructure, a varnish layer 6 is first applied, as shown in FIG. 2. This varnish layer 6 is to be structured in such a way that its contours correspond to the layer of the first material to be produced, as the final result, using the method according to the invention. For this purpose, a photoresist which is structured on the substructure 2 by means of known mask technology is particularly suitable. Pursuant to FIG. 2, the varnish layer 6 contains at least one recess 7, in which the substructure 2 is free of the varnish material. The recess 7 may also include the area of the clearance area 5, so that the surface of the substrate 3 is exposed at that location. The varnish material to be used for the layer 6 should be soluble in a first solvent which does not attack the materials of the substructure 2. The first solvent may be acetone, for example.

Figure 3:
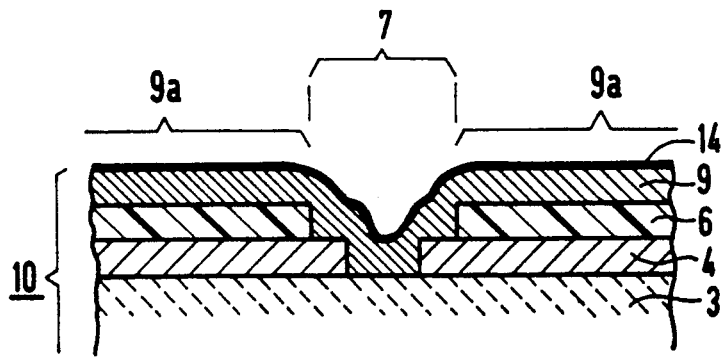

The composite obtained in this manner is designated in general by reference numeral 8. An auxiliary layer 9 of a predetermined third material is then cold-deposited, as shown in FIG. 3. This third material must fulfill a number of conditions:

a) It must be soluble in a second solvent which does not attack the first (insulator) material and the second (HTSC) material;
b) Furthermore, it must not be attacked by the first solvent (e.g., acetone) itself;
c) Finally, it must not enter into any reaction with the first material or the second (HTSC) material at an elevated temperature between 150° C. and 1000° C.,
at which the first material of the layer to be produced can only be deposited. Of course, the third material must also be sufficiently stable at this high deposition temperature (i.e., it cannot decompose at this temperature).

Materials which satisfy these conditions required for the third materials include, in particular, metal oxides such as CaO or SrO, for example, which are soluble in water or in weak bases such as a dilute KOH base or a dilute NaOH base. Furthermore, materials having a metal component that is not also a component of the HTSC material are preferred for the third material. For this reason, CaO is particularly suitable for the HTSC material $YBa_2Cu_3O_{7-x}$.

Since the HTSC material, such as $YBa_2Cu_3O_{7-x}$, $SrTiO_3$ or $LaAlO_3$, is to be evaporated in a hot state directly onto the auxiliary layer 9, which is advantageously made of CaO, in subsequent steps, the auxiliary layer 9 can be sealed, if necessary, with another thin layer 14, which may be in particular a metal or metal oxide. The materials that may be used for this sealing layer, indicated in FIG. 3 by a thick line, include Zr or $ZrO_2$. For example, a Zr layer can very nicely seal off a somewhat rough CaO surface. To form $ZrO_2$, the Zr is oxidized at an $O_2$ pressure of 0.4 mbar, for example, and at a temperature of 800° C.

Figure 4:
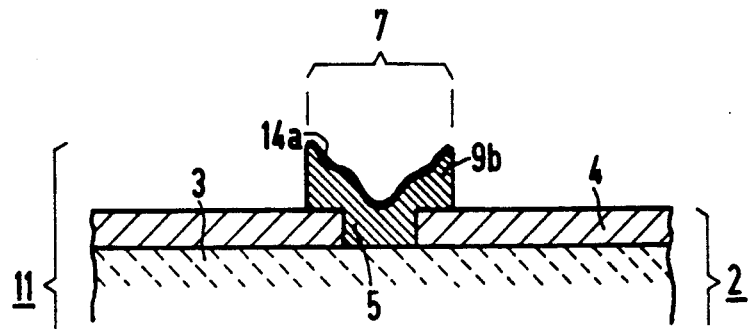

Subsequently, the structured varnish layer 6, along with the part 9a of the auxiliary layer 9 resting on it, is removed, according to a so-called lift-off technique. For this purpose, the entire layer composite 10 seen in FIG. 3 is exposed to the first solvent (acetone) for the varnish material of the layer 6. This solvent only dissolves the varnish layer 6, with the auxiliary layer part 9a which has been resting on it up until this point being removed at the same time. This lift-off technique is assisted by the application of ultrasound waves to the bath of the first solvent. In this way, a composite 11, as shown in FIG. 4, is obtained, consisting of the substructure 2 with a residual part 9b of the auxiliary layer 9 filling the area of both the former recess 7 and the clearance area 5, as well as an exposed surface of the layer 4 of the second (HTSC) material that extends beyond the previous recess 7. The residual part 9b of the auxiliary layer 9 may be covered by a corresponding residual part 14a of the sealing layer 14, if necessary.

Figure 5:
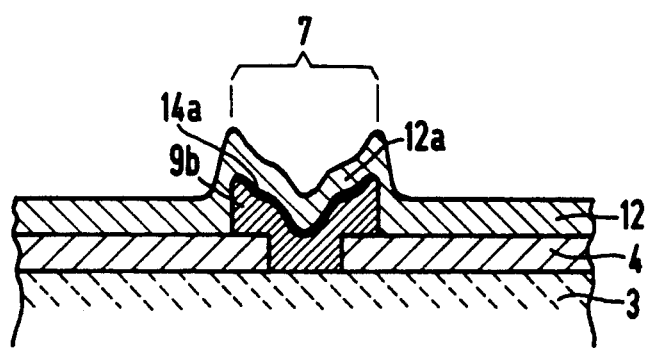

The composite 11 is next covered with a coating layer 12 of the desired first material, as shown in FIG. 5. This coating layer 12 is an insulator material such as that used for the substrate 3. The insulator material should preferably be able to grow epitaxially on the second (HTSC) material of the layer 4. Appropriate insulator materials such as $LaAlO_3$ can only be deposited at elevated temperatures above 150° C., for example, and even above 400° C. to 1000° C., if necessary. It is advantageous if the deposition temperature used in the method according to the present invention can be chosen to be this high, since the materials of the substructure 2, as well as the predetermined material of the residual part 9b of the auxiliary layer 9, do not enter into reactions with each other at these temperatures.

Figure 6:
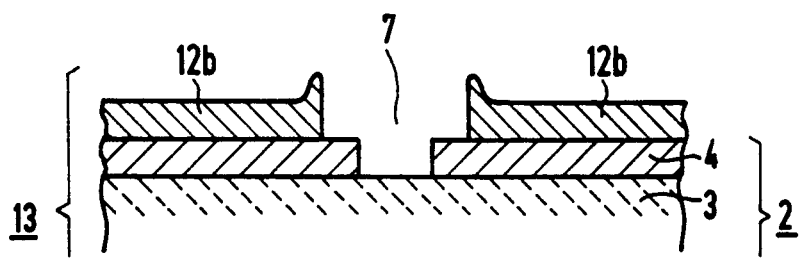

Finally, in yet another lift-off step, the residual part 9b of the auxiliary layer 9 which is located in the area of the former recess 7 is removed, along with the part 12a of the coating layer 12 of the first (insulator) material resting on it. This lift-off step is accomplished with a second solvent, such as water with a dilute base, which dissolves the material of the auxiliary layer. Once again, it is advantageous if ultrasound is used. The second solvent does not attack the HTSC material (second material) or the insulator material (first material). FIG. 6 shows the resulting composite, designated generally by reference numeral 13, which has the desired structured layer 12b of the insulator material deposited on the layer 4 of the HTSC material.

In accordance with the method of the present invention described above, additional structured layers of an HTSC material or insulator material can now be applied to composite 13. In this manner, superconductive multilayer wiring can be produced using HTSC material, including through-contacts and intersections of superconductive tracks, as well as insulator edges to produce so-called "weak links" using HTSC material (cf. DE-OS 38 22 904, for example).

Figure 7:
FIGS. 7 and 8 show a top view of the structure shown in FIG. 1 and FIG. 6, respectively.
Figure 8:
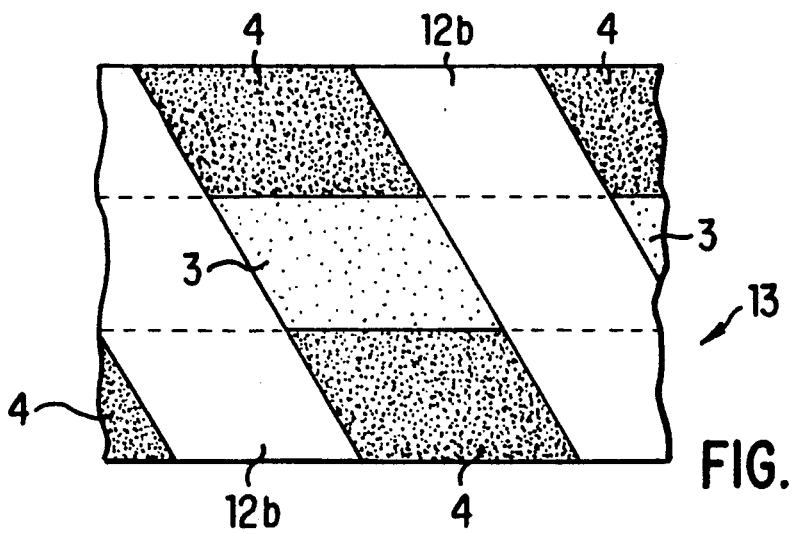
Figure 9:
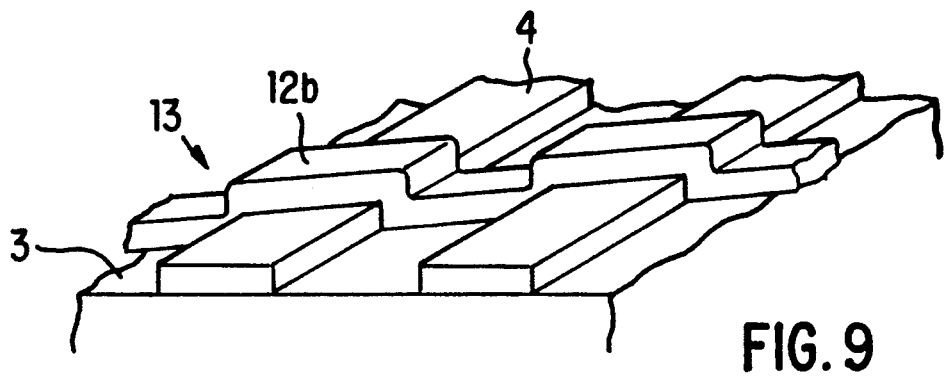
FIG. 9 shows a perspective view of the structure shown in FIG. 8.

For a further illustration of the method according to the invention, a top view of a section of the substructure 2 (seen in FIG. 1) is shown in FIG. 7, and a corresponding segment of the composite 13 formed by the method of the present invention (seen in FIG. 6) is shown in FIG. 8, also in a top view. FIG. 9 shows a perspective view of the section of the composite 13 seen in FIG. 8.

According to the embodiment of the invention selected for illustration above, it was assumed that the substructure 2 included an HTSC layer, which was structured, if necessary, on a suitable substrate 3. Of course, a different substructure can be used in connection with the method of the invention. This substructure may only include an insulator material, possibly structured, for the second material, at least on its surface to be coated, or the substructure may be the substrate itself.

What is claimed is:

1. A method for producing a layer having a structure formed of a first material having at least one recess, said structured layer being deposited on a substructure formed of at least one second material, one of said first and second materials including a metal oxide superconductor material with a high transition temperature which is sensitive to solvents containing acids, said method comprising the steps of:

forming a first composite by applying a varnish layer to the substructure, the varnish layer is soluble in a first solvent that does not attack the substructure and has a structure corresponding to the structure of the structured layer of the first material to be produced;

cold depositing, on the first composite, an auxiliary layer of a third material that is soluble in a second solvent which does not attack the first and second materials and which cannot be attacked by the first solvent and does not enter into any reaction with the first and second materials at an elevated deposition temperature at which the first material is deposited, and further is itself substantially unreactive at the elevated deposition temperature;

forming a second composite from the first composite by removing the varnish layer along with a part of the auxiliary layer resting thereon using the first solvent;

applying the layer of the first material to said second composite at said elevated deposition temperature that is approximately between 150° C. and 1000° C. in an atmosphere containing oxygen; and removing with the second solvent a remaining part of the auxiliary layer remaining in the area of the at least one recess along with the portion of the layer of the first material resting thereon.

2. The method of claim 1, wherein the substructure is structured.

3. The method of claim 1, further comprising the step of covering the auxiliary layer with a sealing layer before removing the varnish layer.

4. The method of claim 3, wherein the sealing layer comprises a metal or metal oxide.

5. The method of claim 1, wherein the step of removing the varnish layer along with the part of the auxiliary layer resting thereon comprises the step of removing the layers by a lift-off technique.

6. The method of claim 1, wherein the step of removing the remaining part of the auxiliary layer comprises the step of removing the remaining part of the auxiliary layer by a lift-off technique.

7. The method of claim 5, wherein the step of removing the remaining part of the auxiliary layer comprises the step of removing the remaining part of the auxiliary layer by a lift-off technique.

8. The method of claim 5, wherein the step of removing the varnish layer by the lift-off technique comprises the step of applying ultrasound waves to the solvent.

9. The method of claim 5, wherein the step of removing the remaining part of the auxiliary layer comprises the step of applying ultrasound waves to the solvent.

10. The method of claim 8, wherein the step of removing the remaining part of the auxiliary layer comprises the step of applying ultrasound waves to the solvent.

11. The method of claim 1, wherein the varnish layer comprises a photo resist.

12. The method of claim 9, wherein the varnish layer comprises a photo resist.

13. The method of claim 1, wherein the first solvent comprises acetone.

14. The method of claim 1, wherein the auxiliary layer comprises a metal oxide soluble in water.

15. The method of claim 1, wherein the auxiliary layer comprises a metal oxide soluble in a weak base.

16. The method of claim 14, wherein the metal oxide is not a component of the superconductor material.

17. The method of claim 14, wherein the auxiliary layer comprises CaO.

18. The method of claim 14, wherein the auxiliary layer comprises SrO.

19. The method of claim 1, wherein the first material comprises an insulator material that allows a textured superconductor material to be applied thereon.

20. The method of claim 5, wherein the first material comprises an insulator material that allows a textured superconductor material to be applied thereon.

21. The method of claim 1, wherein the second material comprises an insulator material that allows a textured superconductor material to be applied thereon.

22. The method of claim 19, wherein the insulator material is selected from the group consisting essentially of $SrTiO_3$, $LaAlO_3$, and $GaO_3$, MgO and $ZrO_2$.

23. The method of claim 21, wherein the insulator material is selected from the group consisting essentially of $SrTiO_3$, $LaAlO_3$, $NdGaO_3$, MgO and $ZrO_2$.

* * * * *